US006873205B1

(12) United States Patent
Tsividis et al.

(10) Patent No.: US 6,873,205 B1
(45) Date of Patent: Mar. 29, 2005

(54) ACTIVE CONTINUOUS-TIME FILTER WITH INCREASED DYNAMIC RANGE IN THE PRESENCE OF BLOCKER SIGNALS

(75) Inventors: Yannis Tsividis, New York, NY (US); Atsushi Yoshizawa, New York, NY (US)

(73) Assignees: The Trustees of Columbia University in the City of New York, New York, NY (US); Sony Corporation (JP)

(*) Notice: Subject to any disclaimer, the term of this patent is extended or adjusted under 35 U.S.C. 154(b) by 0 days.

(21) Appl. No.: 10/399,436
(22) PCT Filed: Oct. 29, 2001
(86) PCT No.: PCT/US01/48232
§ 371 (c)(1), (2), (4) Date: Sep. 29, 2003
(87) PCT Pub. No.: WO02/35756
PCT Pub. Date: May 2, 2002

Related U.S. Application Data
(60) Provisional application No. 60/243,939, filed on Oct. 27, 2000.

(51) Int. Cl.[7] ............................................... H03K 5/00
(52) U.S. Cl. .................................................... 327/552
(58) Field of Search ............................ 327/552–559, 327/103

(56) References Cited

U.S. PATENT DOCUMENTS

| 4,604,568 A | 8/1986 | Prieto ........................ 323/315 |
| 4,691,171 A | 9/1987 | Van Roermund et al. ... 327/554 |
| 4,823,092 A | 4/1989 | Pennock ..................... 330/253 |
| 4,839,542 A | 6/1989 | Robinson ................... 327/558 |
| 4,926,139 A | 5/1990 | Anderson et al. ........... 330/294 |
| 5,081,423 A | 1/1992 | Koyama et al. ............ 327/361 |
| 5,736,909 A | 4/1998 | Hauser et al. .............. 333/166 |
| 5,966,046 A | 10/1999 | Bezzam et al. ............. 327/552 |
| 6,046,632 A * | 4/2000 | Straw ............................ 330/2 |
| 6,112,125 A * | 8/2000 | Sandusky ..................... 700/28 |
| 6,268,765 B1 | 7/2001 | Goplnathan et al. ........ 712/215 |
| 6,404,278 B2 * | 6/2002 | Allen et al. ................. 327/557 |

OTHER PUBLICATIONS

FA 10.6: "Baseband Filters for IS–95 CDMA Receiver Applications Featuring Digital Automatic Frequency Tuning" by Haideh Khorramabadi, Maurice J. Tarsia, Nam S. Woo, 1996 IEE Int'l. Solid State Circuits Conference p. 172.

"A 2.7–V, 200–kHz, 49–dBm, Stopband–IIP3, Low–Noise, Fully Balanced Gm–C Filter IC" by Tetsuro Itakura et al., IEEE Journal of Solid–State Circuits, vol. 34, No. 8, Aug. 1999.

"Fully Integrated Active RC Filters in MOS Technology" by Mihal Banu and Yannis Tsividis, IEEE Journal of Solid–Stae Circuits, vol. SC–18, No. 6, Dec. 1983.

"Highly–Linear Canonical MOSFET–Capacitor Filters" by Takagit et al., The Transactions of the IEJCE, vol. E71, No. 6 Jun. 1988.

(Continued)

Primary Examiner—Dinh T. Le
(74) Attorney, Agent, or Firm—Baker Botts L.L.P.

(57) ABSTRACT

An active filter (100) is disclosed with improved blocker signal rejection characteristics. Linear resistors, such as fixed value resistors (3, 4) are used at the input stage (72) of the filter (100) to suppress any blocker signal. A gain compensation stage (57) is added to the output stage (23) using resistors (24) fabricated with the same technology used to fabricate the input resistors (3, 4) in order to offset any gain changes associated with the input fixed value resistors (3, 4). In an exemplary embodiment, the fixed value resistors (3, 4) are fabricated using polysilicon.

7 Claims, 9 Drawing Sheets

OTHER PUBLICATIONS

"An Elliptic Continuous–Time CMOS Filter with On–Chip Automatic Tuning" by Mihai Banu and Yannis Tsividis, IEEE Journal of Solid–State Circuits, vol. SC–20, No. 6, Dec. 1985.

"CMOS operational transresistance amplifier for analog signal processing" by Salama and Soliman, Microelectronics Journal, 30 (1999) 235–245.

"High–Frequency CMOS Continuous–Time Filters" by Khorramabadi and Gray, IEEE Journal of Solid–State Circuits, vol. SC–19, No. 6, Dec. 1984.

"A Realization of a High–Frequency Monolithic Integrator with Low Power Dissipation and Its Application to an Active RC Filter" by Matsumoto and Ishibashi, IEICE Trans Fundamentals, vol. E79–A, No. 2 Feb. 1996.

* cited by examiner

ACTIVE CONTINUOUS-TIME FILTER WITH INCREASED DYNAMIC RANGE IN THE PRESENCE OF BLOCKER SIGNALS

RELATED APPLICATION

This application claim priority from provisional U.S. Application No. 60/243,939 filed Oct. 27, 2000, which is incorporated herein by reference.

BACKGROUND OF THE INVENTION

Radio communication receivers must receive desired signals at predetermined frequencies while filtering out undesired signals at other frequencies. The undesired signals can have a much larger signal strength than the desired signals. These undesired signals are called "blockers" and are problematic because the filter that removes them must operate in its linear region to avoid distortion. Therefore, the maximum amplitude of all signals applied to the filter input must be limited so that the blocker signals do not cause saturation, clipping or subtler forms of distortion such as intermodulation (a typical measure of which is out-of-band third order input intercept point or IIP3) in the filter. Consequently, the strength of the entire range of signals to be processed, including the blocker signal and the desired signal, must be appropriately limited. This means that the desired signal, which can be orders of magnitude smaller than the blocker signals, will be limited to an extremely small amplitude and can fall below the noise floor of the filter.

To keep the signal-to-noise ratio within a reasonable range, the noise of the filter, which is advantageously implemented as an integrator circuit, must be kept extremely low which can result in a large chip area and have large power dissipation. Accordingly, it is difficult to implement these filters on an integrated circuit chip, necessitating the use of other technologies which can have penalties in terms of cost and size.

One technique known in the prior art to construct a radio communication receiver is the active RC technique as described in Mihai Banu & Yarmis Tsividis, *An Elliptic Continuous-Time CMOS Filter with On-Chip Automatic Tuning*, SC-20 IEEE Journal of Solid-State Circuits, 1114, 1114–1121 (December 1985). This technique employs fully-balanced integrator stages, each stage consisting of resistors, capacitors and operational amplifiers. Fully-balanced operation, which means that each integrator has two output terminals where the signals at each output terminal are identical in magnitude to one another, but have opposite polarity, improves the filter's common-mode interference rejection performance. Because the frequency response of an active filter designed in this fashion depend on the resistance and capacitance values of the chip components, and because those values may vary due to fabrication tolerances and temperature variations, a technique was described for making the resistors in the active filter tunable to compensate for unwanted variations in the frequency response of the filter. Specifically, the prior art describes all of the resistance element in the active filter being embodied as MOSFETs operating in their triode or nonsaturation region, designed and biased to function as variable resistors whose resistance is tuned by the gate voltage applied to the MOSFETs. This technique suffers from the disadvantage that large blocker signals present at the input of the active filter may force the MOSFETs that are functioning as variable resistors into a non-linear region of operation, thereby causing distortion in the signals present at the output of the active filter, as previously described.

SUMMARY OF THE INVENTION

It is an object of the present invention to process the desired signal and reject blocker signals without excessive power dissipation or chip area. The object is achieved by the introduction of linear resistance elements to the input stage of the active filter. The response of the fixed-value resistors at the input stage remains linear despite the large blocker signals at the input of the filter. The blocker signals are sufficiently attenuated by the input stage so that subsequent MOSFETs are not forced into a non-linear region of operation by the blocker signals. A gain compensation stage is added to the active filter to offset any changes to the gain of the filter caused by the use of both the linear resistance and the variable MOSFET resistance elements.

In one exemplary embodiment of the present invention, an active filter is provided having a first fully balanced active integrator with linear resistance elements such as fixed value resistors at the input stage, at least one intermediate fully balanced active integrator with variable value resistors at the input stage and a variable gain output stage compensating for the gain variation caused by the mismatch of the fixed value resistors to the variable value resistors.

In another exemplary embodiment, the fixed resistors are polysilicon resistors.

In another exemplary embodiment, the variable resistors are tunable metal oxide silicon field effect transistors (MOSFETs).

In a further exemplary embodiment, the gain of the variable gain output stage corresponds to the ratio of the resistances of the linear resistors and the variable value resistors.

In a still further exemplary embodiment, the active filter includes a phase equal circuit connected to the filter output.

In yet another exemplary embodiment, the active filter includes coupling capacitors interconnecting the various integrator stages.

DESCRIPTION OF THE EXEMPLARY EMBODIMENTS

Figure 1:
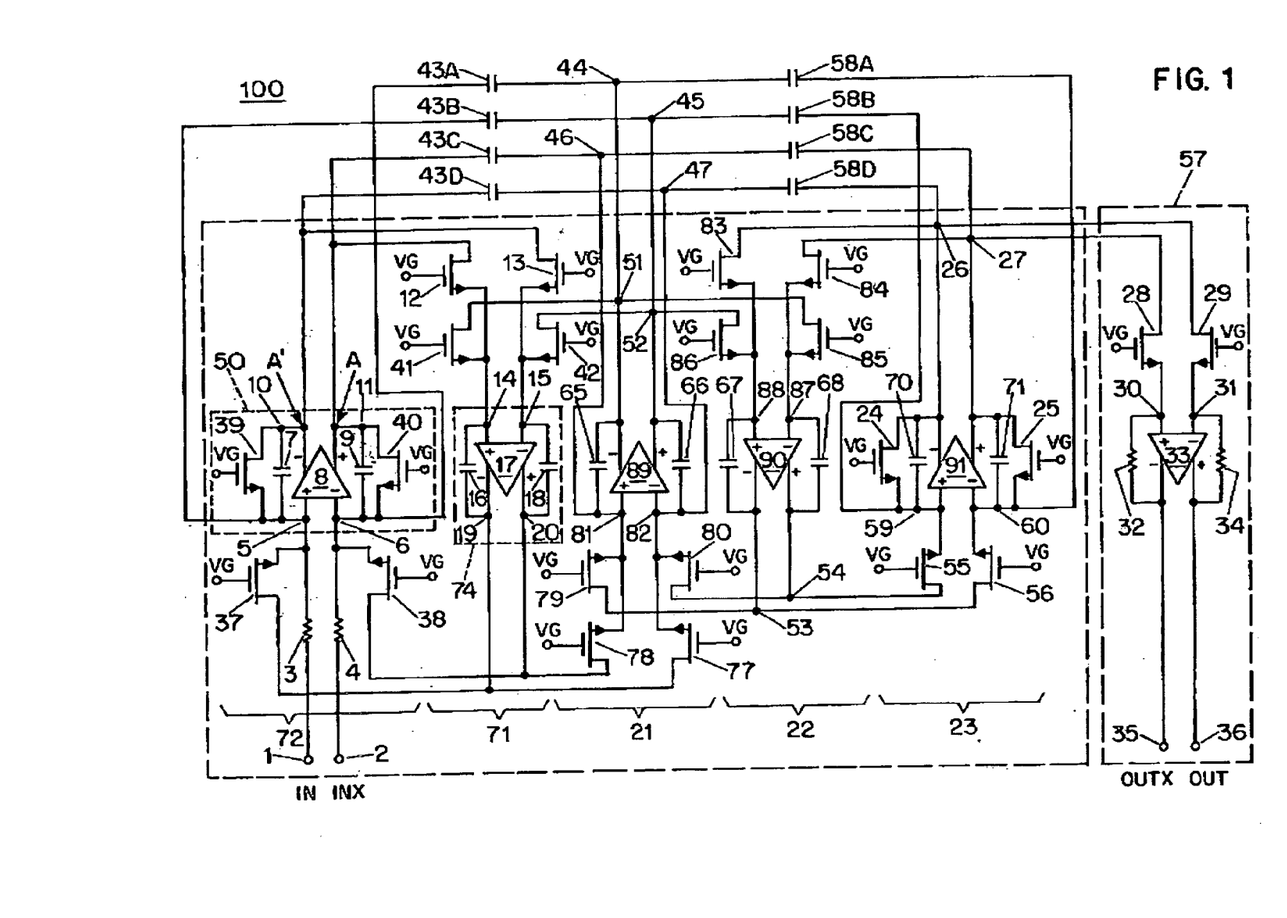
FIG. 1 is a circuit diagram illustrating an exemplary embodiment of the present invention.

In FIG. 1 an exemplary embodiment of a low-pass filter in accordance with the invention for a direct conversion or zero intermediate frequency receiver is illustrated. The embodiment described has a cut-off frequency of 1.92 MHz, in-band gain of 8.5 dB and out-of-band reaction at 10 MHz of 64 dB.

In operation, fully balanced input signals are applied at input terminals 1 and 2 of the filter. For purposes of this specification and claims, fully balanced means the signals at each input terminal of a circuit are identical in magnitude to one another except have opposite polarity (i.e. the signals are 180° out of phase with respect to one another), and the signals at each output terminal of the circuit are identical to one another except have opposite polarity. The input signals pass through first fully balanced integrator 72 which consists of linear (e.g. fixed value) resistors 3 and 4, fully differential amplifier 8, linear capacitors 7 and 9, variable resistors 37, 38, 39 and 40. Fully differential amplifier 8 has a non-inverting input 5, an inverting input 6, a inverting output 10 and a non-inverting output 11. Fully differential amplifier 8 is described in detail herein with reference to FIG. 2. Linear capacitor 7 and variable resistor 39 are connected in parallel between the non-inverting input 5 and the inverting output 10 of amplifier 8. Similarly, linear capacitor 9 and variable resistor 40 are connected in parallel between the inverting input 6 and the non-inverting output 11 of amplifier 8. Linear resistors 3 and 4 are preferably polysilicon resistors with nominal resistance of 5 kΩ. Variable resistors 37, 38, 39 and 40 are preferably MOSFETs operating in the triode or nonsaturation region each designed and biased at its gate terminal to have a nominal resistance of 5 kΩ. The gate voltage $V_G$ of the MOSFET transistors controls the channel resistance of the MOSFET devices, causing them to function as voltage controlled resistors. Gate voltage $V_G$ of variable MOSFET resistors 37, 38, 39 and 40 is discussed in detail herein with respect to FIGS. 3–8. linear capacitors 7 and 9 are preferably composed of polysilicon plates and each have a capacitance of 17.7 pF.

After passing through integrator 72, the blocker signal is partially attenuated in the fully balanced output signals present at output nodes 10 and 11. The output signals of the integrator 72 are then applied to a first intermediate fully balanced active integrator 71, first passing through variable resistors 12 and 13. Variable MOSFET resistors 12 and 13 are implemented identically to variable MOSFET resistors 39 and 40. The signals then pass through balanced amplifier 17 and linear capacitors 16 and 18. Fully balanced amplifier 17 is identical to fully balanced amplifier 8. Linear capacitors 16 and 18, like linear capacitors 7 and 9, are preferably formed with polysilicon plates, each having a capacitance of 23.7 pF.

The first intermediate integrator stage 71 provides fully balanced output signals at terminals 19 and 20 with the blocker signal further attenuated. The signals then enter a second intermediate integrator 21, identical to the first intermediate integrator 71 but with linear feedback capacitors 65 and 66 each having a capacitance of 35.3 pF. The signals at terminals 19 and 20 are applied to the second intermediate integrator 21 at variable MOSFET input resistors 77 and 78, respectively, which are connected to the inverted input 82 and the non-inverted input 81 of fully balanced amplifier 89 of the second intermediate integrator 21, respectively. The second intermediate integrator 21 provides fully balanced output signals at terminals 51 and 52 with the blocker signal further attenuate. The signals at terminals 51 and 52 are the applied to a third intermediate integrator stage 22, identical to second intermediate integrator stage 21. The signals at terminals 51 and 52 are received by the third intermediate integrator 22 through variable MOSFET input resistors 85 and 86, respectively, which are connected to the inverted input 87 and the non-inverted input 88 of fully balanced amplifier 90 of the integrator 22, respectively. The third intermediate integrator 22 provides fully balanced output signals at terminals 53 and 54 with the blocker signal further attenuated.

The signals at terminals 53 and 54 are applied to a final integrator 23 through variable MOSFET resistors 56 and 55, respectively, which are connected to the inverted input 60 and the non-inverted input 59 of the fully balanced amplifier 91 of the integrator 23, respectively. The final integrator 23 is identical to the initial integrator 72, but with variable MOSFET resistors 55 and 56 at the input stage rather than fixed value resistors 3 and 4 and with feedback linear capacitors 70 and 71 each having a capacitance of 17.7 pF. The signals provided by the final integrator stage are fully balanced signals present at terminals 26 and 27. At this stage, the blocker signal will be nearly completely eliminated from the output signal. However, because linear resistors 3 and 4 have a different physical structure than that of the MOSFETs, there is no correlation between the values of the fixed resistors and the values of the variable resistors (i.e. the MOSFETs) over fabrication tolerances and temperature variations, which can cause undesired variations of filter gain. Consequently, a variable gain output stage 57 is utilized to compensate for the undesired gain variation.

The signals at terminals 26 and 27 enter variable gain output stage 57 through variable MOSFET resistors 28 and 29, each having a nominal resistance of 5 kΩ. The signals then pass through amplifier 33 having linear feedback resistors 32 and 34. Linear resistors 32 and 34 are selected to offset the effect variation caused by linear resistors 3 and 4. In the exemplary embodiment illustrated in FIG. 1, it can be shown that the gain of the active filter 100 is proportional to the resistance of the linear output resistors 32 and 34 and inversely proportional to twice the resistance of the linear input resistors 3 and 4. Accordingly, resistors 32 and 34 are preferably polysilicon resistors with nominal resistance of 10 kΩ which ensures the nominal gain of the filter is 0 dB. The non-inverting and inverting outputs of amplifier 33 are connected to the non-inverting and inverting outputs 36 and 35 of the active filter 100.

As can be seen in FIG. 1, the exemplary embodiment utilizes four coupling capacitors 43A, 43B, 43C, 43D connected between terminals 6 and 44, 5 and 45, 11 and 46, and 10 and 47, respectively, and four coupling capacitors 58A, 58B, 58C, 58D connected between terminals 44 and 60, 45 and 59, 46 and 27, and 47 and 26 respectively. Adjusting the capacitance of these coupling capacitors correspondingly adjusts placement of the transmission zeros on the frequency response plot of the filter. In an exemplary embodiment, the two groups of coupling capacitors 43A, 43B, 43C and 43D, and 58A, 58B, 58C and 58D each consist of polysilicon plate capacitors, where the capacitors of the first group 43A, 43B, 43C and 43D each have a capacitance of 2.46 pF and the capacitors of the second group 58A, 58B, 58C and 58D each have a capacitance of 0.904 pF.

Additionally, as can be seen from FIG. 1, the integrators 72, 71, 21 and 22 each have a second set of signal inputs for accepting the feedback signal from the output of the subsequent integrator. Specifically, variable MOSFET resistors 37 and 38 connect the inverted and non-inverted output of the second integrator 71 at terminals 19 and 20, respectively, to the non-inverting and inverting inputs of the first fully balanced amplifier 8 at terminals 5 and 6, respectively. Consequently, the signals present at the inverted and non-inverted output terminals 10, 11 of the fully balanced amplifier 8 of the integrator 72 represent the integral of the sum of the two input signals (i.e. the balanced primary input signals present at terminals 1, 2 and the balanced feedback input signal present at terminals 19, 20). In a similar fashion, variable MOSFET resistors 41 and 42 connect the inverted and non-inverted outputs of the amplifier 89 of the third integrator 21 at terminals 51 and 52, respectively, to the non-inverting and inverting inputs of the amplifier 17 of the second integrator 71 at terminals 14 and 15, respectively. Further, the inverted and non-inverted outputs of amplifier 90 of integrator 22 at terminals 53 and 54, respectively, are fed back through variable MOSFET resistors 79 and 80, respectively, into the non-inverted and inverted inputs 81 and 82 of fully balanced amplifier 89 of integrator 21, respectively, and the inverted and non-inverted outputs of fully balanced amplifier 91 of integrator 23 at terminals 26 and 27, respectively are fed back through variable MOSFET resistors 83 and 84, respectively, into the non-inverted and inverted inputs 88 and 89 of the fully balanced amplifier 90 of integrator 22, respectively. All MOSFET variable resistors 12, 13, 24, 25, 28, 29, 37, 38, 39, 40, 41, 42, 55, 56, 77, 78, 79, 80, 83, 84, 85 and 86, in circuit 100 are preferably identical. In the exemplary embodiment shown in FIG. 1, all variable resistors are n-channel MOSFETS.

Figure 2:
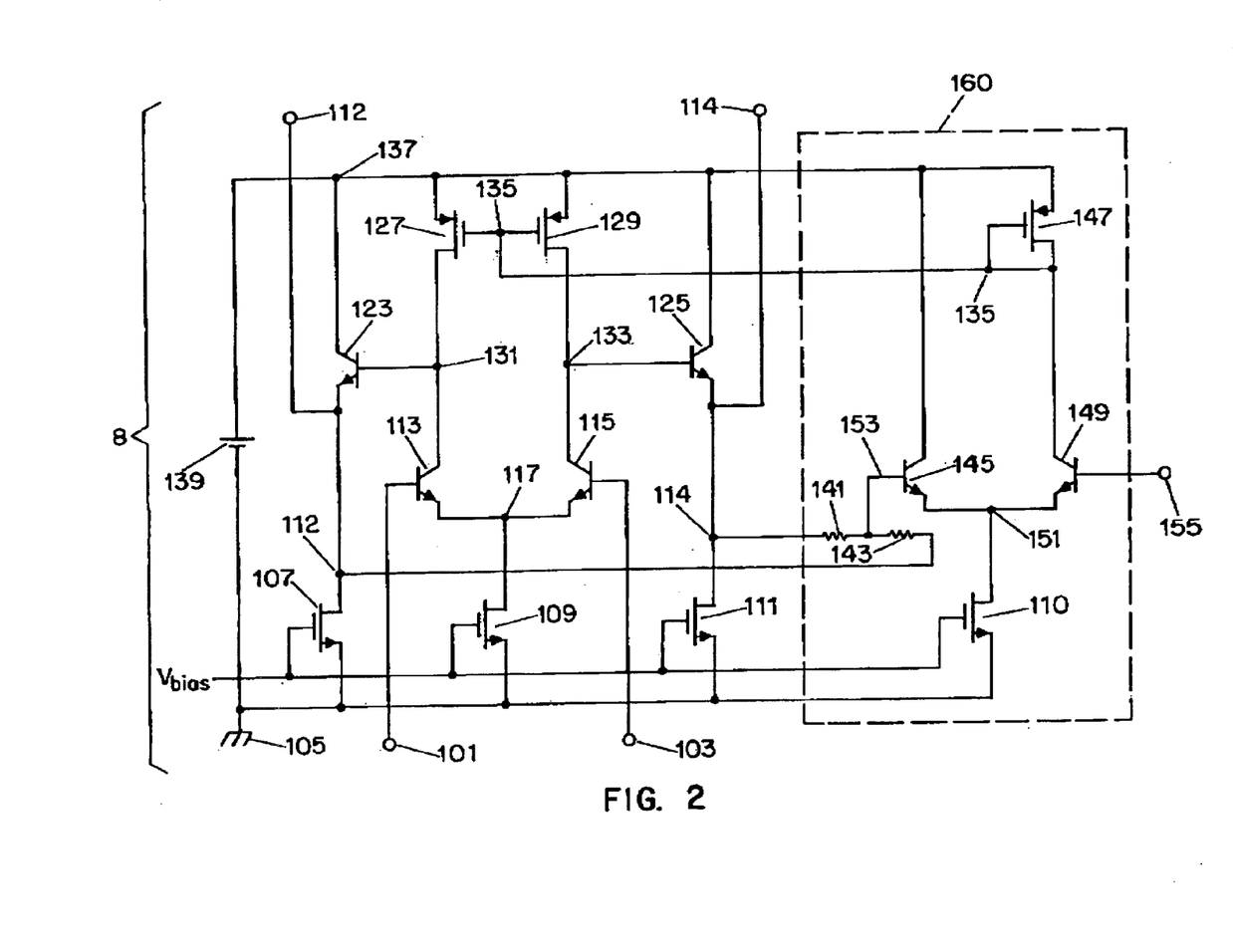
FIG. 2 is a circuit diagram illustrating an implementation of a balanced amplifier useful in the embodiment illustrated in FIG. 1.

Referring now to FIG. 2, an exemplary embodiment of the fully balanced amplifier 8 used in the filter 100 illustrated in FIG. 1 is shown. Other amplifiers 17, 89, 90, 91 and 93 illustrated in FIG. 1 have identical structures. The operation of fully balanced amplifier 8 will be apparent to one of ordinary skill in the art.

Input signals are is applied to the non-inverting and inverting inputs of the fully balanced amplifier 8 at terminals 101 and 103, respectively, which voltages are in turn applied to the base terminals of npn bipolar junction transistors (BJT) 113 and 115. The emitter terminals of transistors 113 and 115 are tied together at node 117 and connected to the drain of an n-channel MOSFET current source 109 having its source terminal connected to ground 105. The collector terminals of transistors 113 and 115 are tied to the drain terminal of p-channel MOSFETs 127 and 129 respectively at nodes 131 and 133. The gate terminals of transistors 127 and 129 are connected together at node 135.

Node 131 is connected to the base terminal of npn BJT 123. The emitter terminal 112 of transistor 123 is tied to the drain terminal of a MOSFET current source 107, which in turn has its source terminal connected to ground node 105. Terminal 112 also serves as a first (non-inverted) fully balanced output terminal. Similarly, node 133 is connected to the base terminal of npn BJT 125. The emitter terminal 114 of transistor 125 is tied to the drain terminal of an n-channel MOSFET current source 111, having its source terminal connected to ground node 105. Terminal 114 also serves as a second (inverted) fully balanced output terminal of the amplifier 8.

The source terminals of transistors 127 and 129 are tied together at supply voltage node 137. The collector terminals of transistors 123 and 125 are also connected to supply voltage node 137.

Amplifier 8 employs a common mode feedback servo circuit 160. Two npn BJTs 145 and 149 have their emitter terminals tied together at node 151 which is connected to the drain terminal of an n-channel MOSFET current source 110, which has its source terminal connected to ground node 105. The base terminal 153 of transistor 145 is connected to the juncture of resistors 141 and 143, each with a nominal resistance of 40 kΩ. Resistor 141 is connected between base terminal 153 of transistor 145 and inverted output terminal 114 of amplifier 8, while resistor 143 is connected between base terminal 153 of transistor 145 and non-inverted output terminal 112 of amplifier 8. The collector terminal of transistor 145 is connected to supply voltage node 137.

The base terminal 155 of transistor 149 is connected to an external voltage source, not shown. The collector terminal of transistor 149 is connected to the drain terminal of p-channel MOSFET 147. The drain terminal of transistor 147 is also tied to gate terminal 135 which, as previously noted, is tied to the commonly connected gate terminals of transistor pair 127 and 129. The source terminal of transistor 147 is connected to voltage supply node 137. Voltage source 139 is connected between ground node 105 and voltage supply node 137.

During operation, the amplifier 8, amplifies the fully balanced input signals present at terminals 101 and 103, and provides fully balanced amplified signals at terminals 112 and 114 respectively. The non-inverted and inverted output signals at terminals 112 and 114 are preferably identical in magnitude but have opposite polarity (i.e. the output signals are 180° out of phase with respect to one another). The average of the signals present at terminals 112 and 114 at any time is set by the voltage present at terminal 155, which in an exemplary embodiment is 1.5V.

Figure 3:
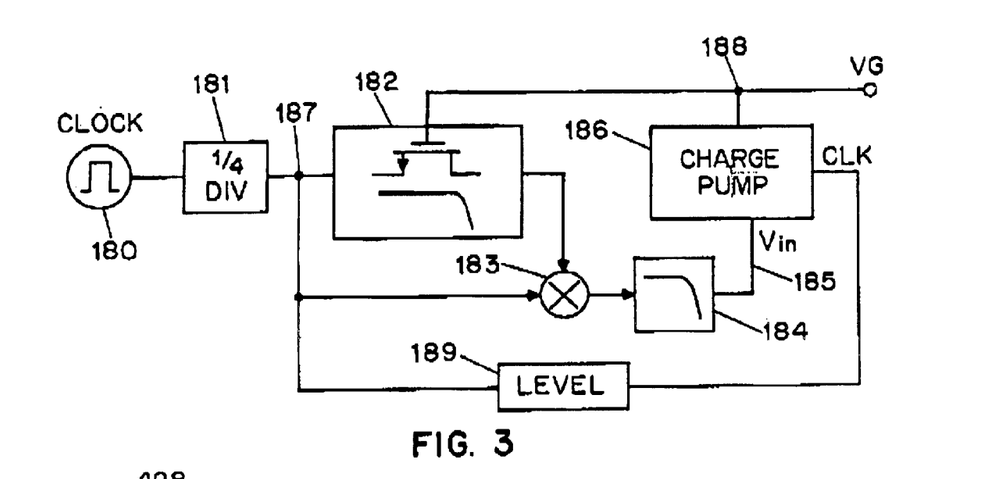
FIG. 3 is a block diagram of a circuit useful as a gate voltage source for the variable resistors illustrated in FIG. 1.

To ensure that the MOSFETs of the filter 100 of FIG. 1 are operating deep within their triode regions of operation and are thus acting as linear gate voltage controlled variable resistors in the circuit of FIG. 1, it is necessary for the gate voltage $V_G$ applied to the MOSFETs acting as variable resistors to be approximately 4V when the nominal channel resistance of the variable MOSFET resistors is 5 kΩ, the channel width is 18 μm, the channel length is 10 μm and source and drain voltages are 1.5V using a common 0.8 μm BiCMOS technology. Because the supply source available in most low-power wireless applications is a low voltage battery cell, such as a lithium-ion cell that provides a supply voltage of 2.7V, a circuit is needed to boost the control voltage which drives the gates of MOSFETs in the filter. Additionally, the circuit supplying $V_G$ will also control the frequency response of the overall active filter by adjusting the resistance of the MOSFET variable resistors, consequently a tuning circuit is needed to control $V_G$ and thereby the cutoff frequency. FIG. 3 shows a tuning circuit suitable for controlling the gate voltage of the variable MOSFET resistors shown in FIG. 1.

Referring to FIG. 3, an external reference clock 180 supplies a signal to a ¼ frequency divider 181, which buffers the rest of the timing circuit from the clock, thus making the tuning circuit insensitive to the reference clock voltage level. The ¼ frequency divider 181 is discussed in detail herein with reference to FIG. 4. The output of the ¼ frequent divider 187 is supplied to a reference filter 182, a voltage multiplier 183 and a voltage level conversion circuit 189, the output of which is fed into charge pump circuit 186. In an exemplary embodiment, the reference filter 182 selected is a second order MOSFET-C Butterworth low-pass filter with a cut off frequency of 3.84 MHz, which ensures that the frequency comparison is performed outside the passband of the active filter the circuit is intended to tune. The reference filter 182 is described in detail herein with reference to FIG. 5.

The output of the reference filter 182 is also supplied to voltage multiplier 183. The output of voltage multiplier 183 is passed through a loop filter 184, which removes high frequency signals generated by the voltage multiplication and allows a DC voltage to pass to charge pump 186. The voltage multiplier and low-pass filter are discussed in detail herein with reference to FIG. 6 and FIG. 7, respectively. Charge pump 186, described in detail below with reference to FIG. 8, boosts the voltage present at its input 185 to generate a sufficient $V_G$ at terminal 188 to tune the MOSFETs acting as variable resistors in the active filter 100 shown in FIG. 1. The output of the charge pump 188 is fedback to the reference filter 182, ensuring the $V_G$ output 188 will vary with temperature changes so as to maintain the desired frequency response of the main active filter 100 shown in FIG. 1.

Figure 4:
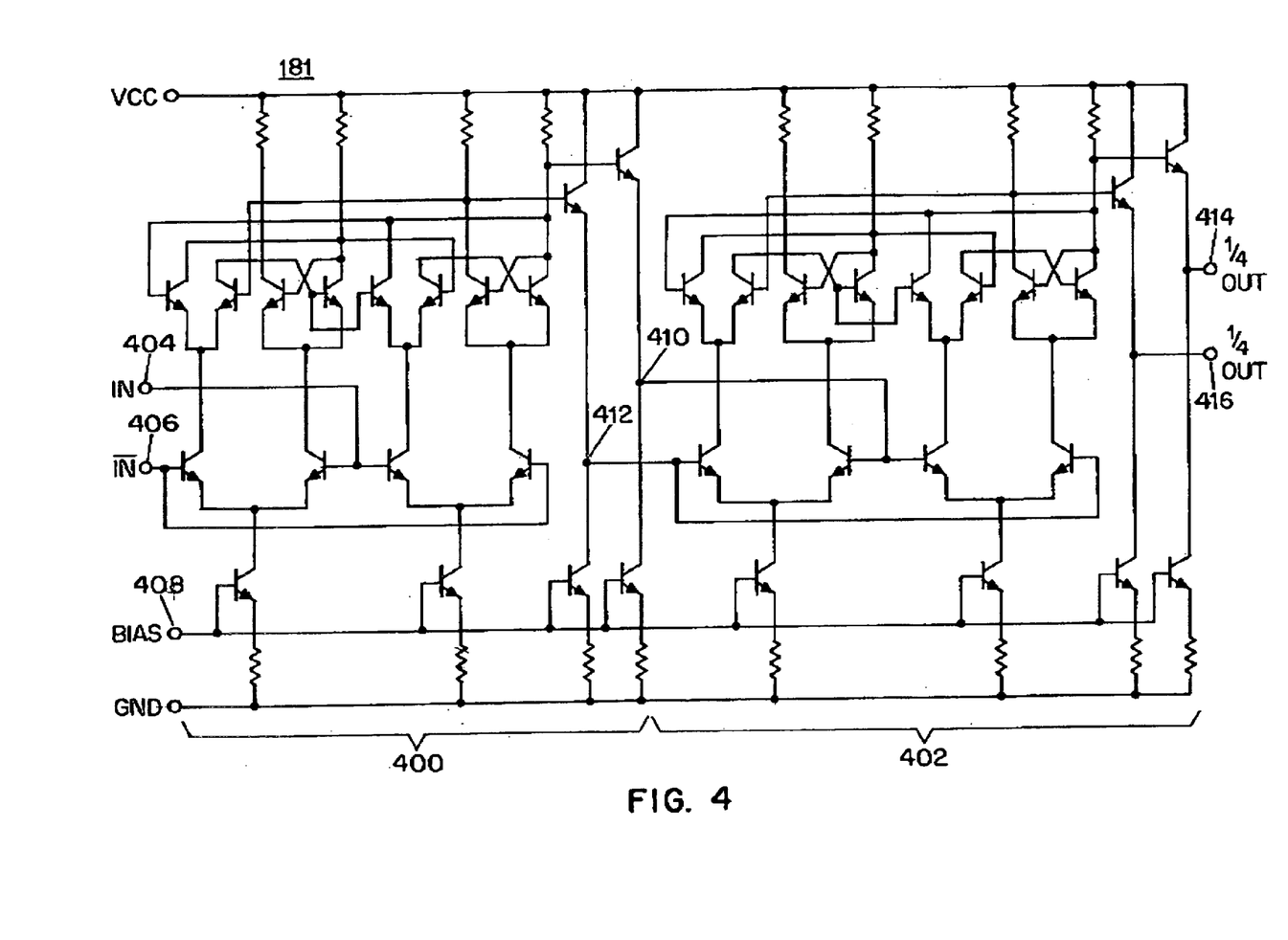
FIG. 4 is a circuit diagram of a one-quarter frequency divider useful in the circuit of FIG. 3.

Referring to FIG. 4, an exemplary embodiment of the ¼ frequency divider 181 of FIG. 3 is illustrated. The output of reference clock 180 of FIG. 3 is applied to non-inverting and inverting input terminals 404 and 406, respectively, of the ¼ frequency divider. In the exemplary embodiment, reference clock 180 of FIG. 3 is set to output a clock signal with frequency 15.36 MHz at 100 $mV_{pp}$. The input clock signal enters a first flip-flop based digital divider 400. The operation of digital divider 400 is well known to one of ordinary skill in the art. The input clock signals at terminals 404 and 406 are divided in frequency by digital divider stage 400, and the non-inverted and inverted outputs of the divider stage 400 are provided at terminals 410 and 412, respectively. The frequency of the output signals at terminals 410 and 412 are one half the frequency of the input clock signals at terminals 404 and 406. The balanced signals at terminals 410 and 412 then enter a second digital divider stage 402, identical to first digital divider stage 400. The second digital divider stage 402 provides non-inverted and inverted output signals at terminals 414 and 416, respectively, where the output signal frequency is ¼ of the frequency of the input clock signals present at terminals 404 and 406. In the exemplary embodiment, Vcc is 2.7 V and the output signal amplitude will typically be 400 $mV_{pp}$.

Figure 4A:
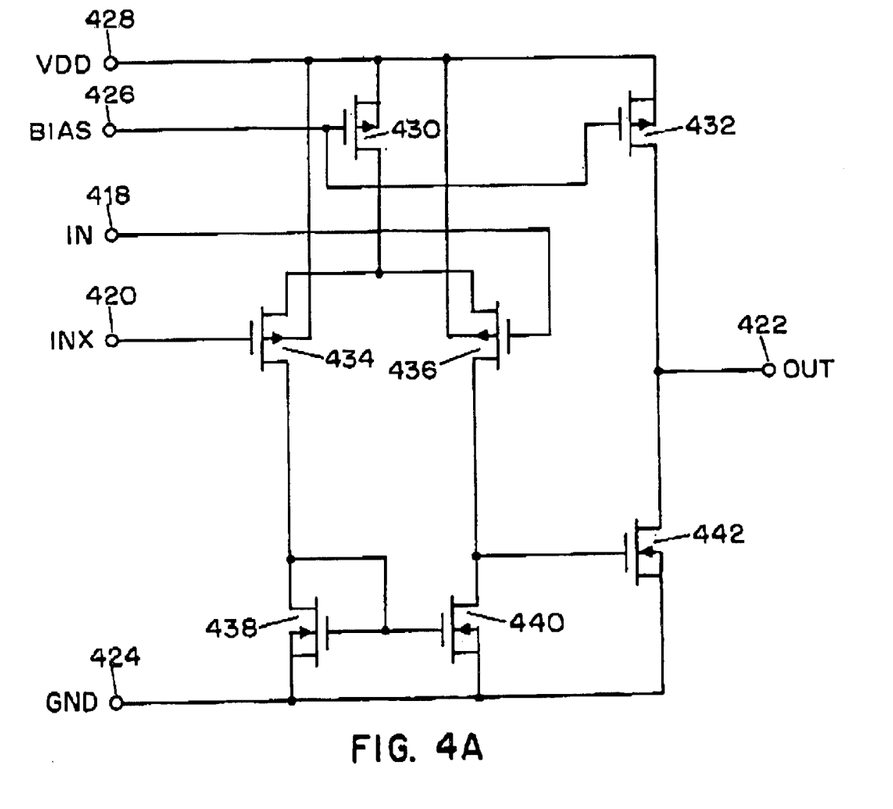
FIG. 4A is a circuit diagram of a voltage converter useful in the circuit of FIG. 3.

In FIG. 4A, an exemplary embodiment of a level conversion circuit is shown. The signals preset at the non-inverted and inverted outputs 414 and 416 of the ¼ frequency divider of FIG. 4, respectively, enter the level conversion circuit at input terminals 418 and 420. The signals at input terminals 418 and 420 are applied to the gate terminals of two p-channel MOSFET transistors 436 and 434, respectively. The drain terminals of transistors 436 and 434 are connected to the drain terminals of two n-channel MOSFET transistors 438 and 440, respectively, each having its substrate and source terminals connected to ground node 424. Additionally, the gate terminals of the transistors 438 and 440 are both connected to the drain terminal of transistor 438. The substrate terminals of input transistors 434 and 436 are each connected to supply voltage node $V_{dd}$ 428, while the source terminals of both input transistors 434 and 436 are tied to the drain terminal of p-channel MOSFET 430. The source and substrate terminals of transistor 430 are, in turn, connected to $V_{dd}$ supply voltage node 428, while the gate terminal of transistor 430 is connected to received a bias voltage $V_{bias}$ at terminal 426. The respective drain terminals of transistors 440 and 436 both are tied to the gate terminal of n-channel MOSFET 442, which has its source and substrate terminals tied to ground node 424. The drain terminal of transistor 442 is tied to the drain terminal of p-channel MOSFET 432, which, in turn has its substrate and source terminals tied to $V_{dd}$ supply voltage node 428 and its gate terminal tied to $V_{bias}$ terminal 426. The voltage at the $V_{bias}$ terminal 426 may be generated by a voltage divider circuit between $V_{dd}$ supply voltage node 428 and ground node 424. The voltage at $V_{bias}$ terminal 426 is selected to ensure that approximately 10 µA of current flows through MOSFET 430. The junction of the drain terminals of transistors 442 and 432 serves as an output terminal 422 of the voltage level converter. This signal present at this output terminal serves as the clock for the charge pump described herein with reference to FIG. 8.

Figure 5:
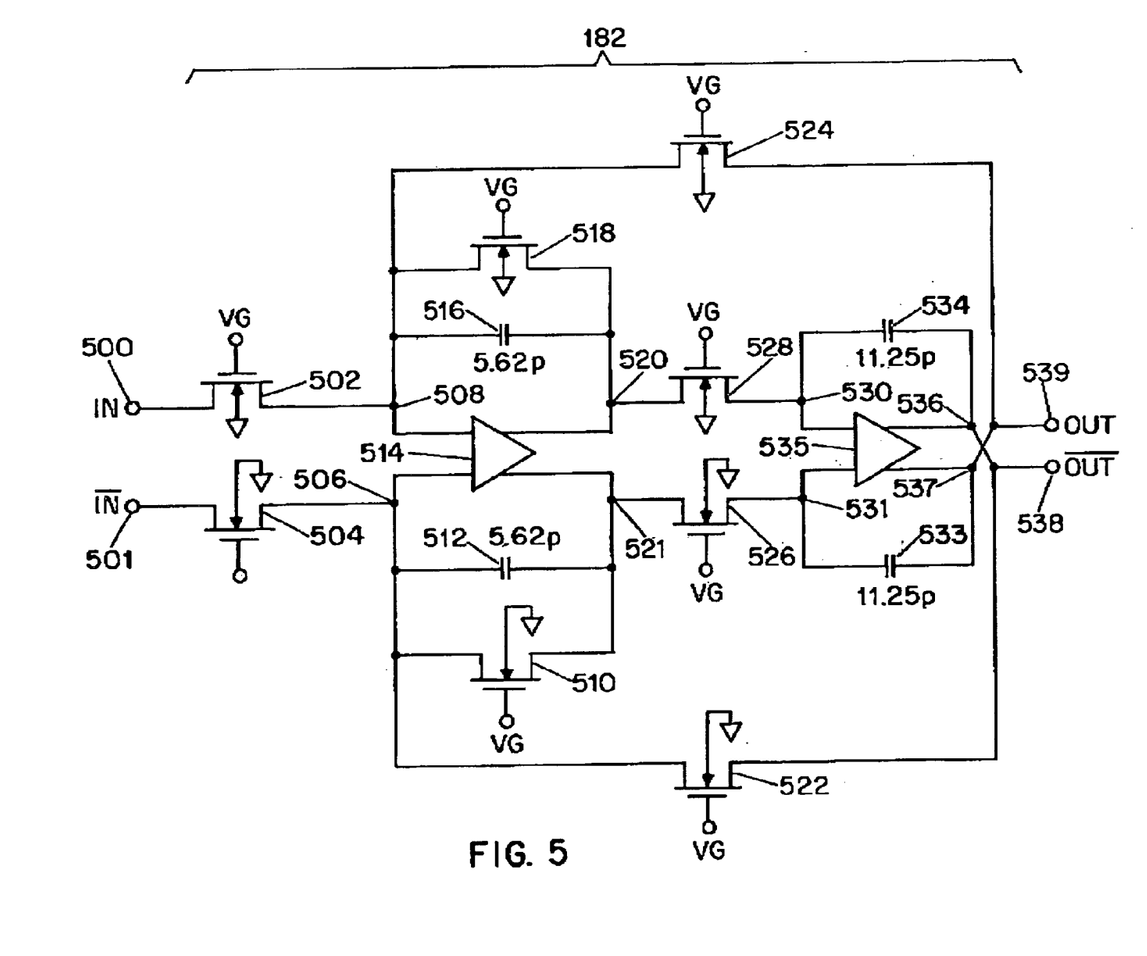
FIG. 5 is a circuit diagram of a reference filter useful in the circuit of FIG. 3.

In FIG. 5 an exemplary embodiment of the second order MOSFET-C Butterworth low-pass reference filter 182 shown in FIG. 3 is illustrated. The respective output signals from the ¼ frequency divider 181 shown in FIG. 3 and FIG. 4 are present at the non-inverting and inverting input terminals 500 and 501 of reference filter 182. The input signal at the non-inverting input terminal 500 passes through a variable n-channel MOSFET resistor 502 and is applied at node 508, while the input signal at the inverting input terminal 501 passes through a variable n-channel MOSFET resistor 504 and is applied at node 506. The respective resistances of the MOSFET resistors 502 and 504 are both controlled by voltage $V_G$ applied to their respective gates as previously described. The signal then enters fully differential amplifier 514, feedback capacitors 512 and 516 and variable n-channel MOSFET feedback resistors 510 and 518. Capacitors 512 and 516 are preferably fabricated in the same manner as the linear capacitors in the active filer 100 shown in FIG. 1, and each has a capacitance of 5.62 pF. Differential amplifier 514 is identical to the amplifiers used in the active filter 100 illustrated in FIG. 1.

The signal present at nodes 506 and 508 are also connected to variable n-channel MOSFET feedback resistors 522 and 524, respectively. MOSFET feedback resistor 522 is connected between node 506 and inverted output terminal 538 of reference filter 182, while MOSFET feedback resistor 524 is connected between node 508 and non-inverted output terminal 539 of reference filter 182.

After passing through the first integrator stage, the signal present at node 520 passes through variable n-channel MOSFET resistor 528 to node 530, while the signal present at node 521 passes through variable n-channel MOSFET resistor 526 to node 531. The balanced signal then enters differential amplifier 535 and linear feedback capacitors 533 and 534. Capacitors 533 and 534 are also preferably fabricated in the same manner as the linear capacitors in the active filter 100 shown in FIG. 1, and each has a capacitance of 11.25 pF. The fully differential amplifier 535 provides its inverted and non-inverted outputs at nodes 536 and 537, respectively. Nodes 536 and 537 are tied to output terminals 538 and 539 of the reference filter 182, respectively.

Figure 6:
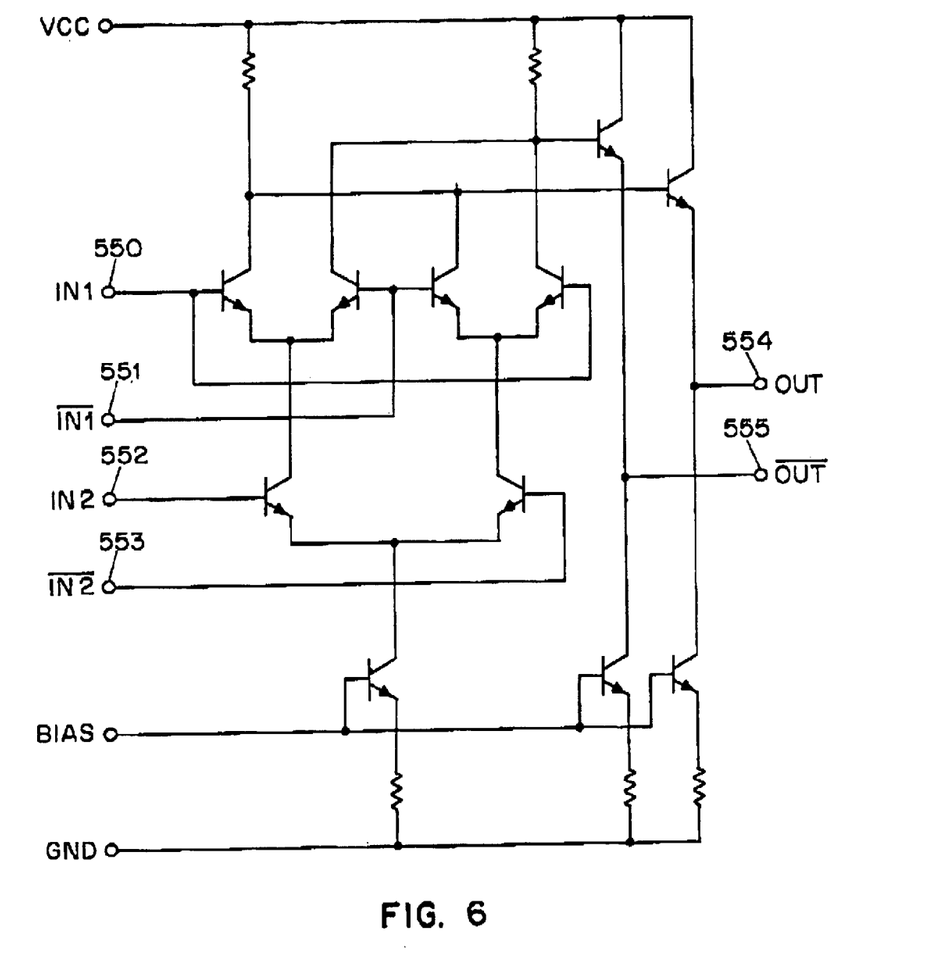
FIG. 6 is a circuit diagram of a voltage multiplier useful in the circuit of FIG. 3.

In FIG. 6, an exemplary embodiment of the voltage multiplier 183 for use in the circuit of FIG. 3 is illustrated. The operation of the voltage multiplier is well known to one of ordinary skill in the art. The non-inverted and inverted signal outputs from the MOSFET-C reference filter 182 shown in FIG. 3 and FIG. 5 enters the voltage multiplier at terminals 552 and 553, respectively. The non-inverted and inverted output signals from the ¼ frequency divider 181 shown in FIG. 3 and FIG. 4 enters the voltage multiplier at terminals 550 and 551, respectively. The respective products of the two non-inverted and the two inverted input voltage signals are provided at output terminals 554 and 555, respectively.

Figure 7:
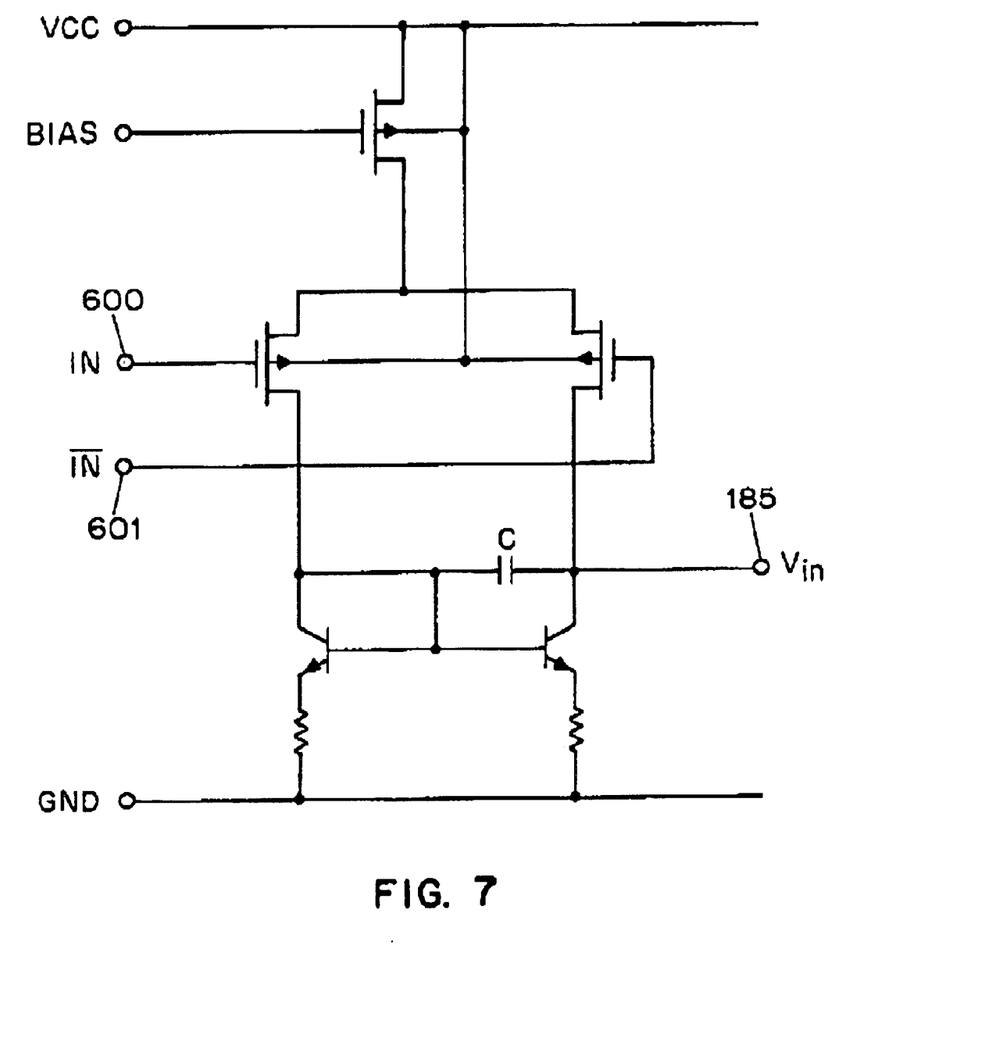
FIG. 7 is a circuit diagram of a low-pass filter useful in the circuit of FIG. 3.

In FIG. 7, an exemplary embodiment of the loop filter 184 for use in the circuit of FIG. 3 is illustrated. The loop filter is a common one pole low-pass filter, well known to one of ordinary skill in the art. The non-inverted and inverted output signals from the voltage multiplier 183 shown in FIG. 3 and FIG. 6 are present at input terminals 600 and 601, respectively. The low-pass filter shown in FIG. 7 filters the input signals to remove unwanted high frequency components generated by the voltage multiplier and to leave a DC voltage $V_G$ required for tuning the MOSFET variable resistors shown in FIG. 1. The filtered signal appears at a single ended output terminal $V_{in}$ 185 as shown in FIGS. 3 and 8.

Figure 8:
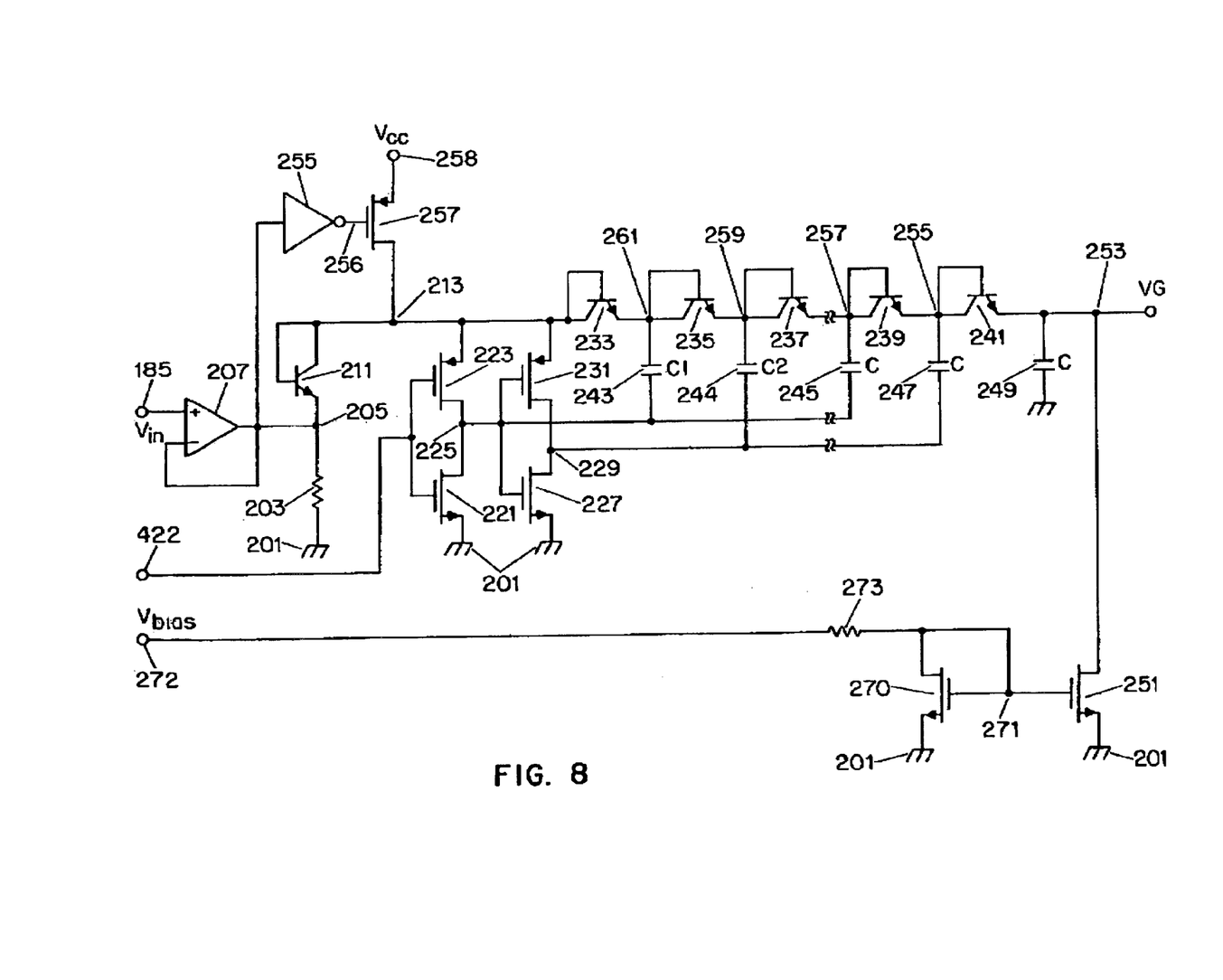
FIG. 8 is a circuit diagram of a charge pump useful in the circuit of FIG. 3.

Referring to FIG. 8, an exemplary embodiment of a charge pump circuit useful in the tuning system of FIG. 3 is shown. The charge pump is based on the Dickson multiplier well known to one of ordinary skill in the art. See J. F. Dickson, *On-chip High Voltage Generation in NMOS Integrated Circuit Using an Improved Voltage Multiplier Technique*, IEEE Journal of Solid-State Circuits, June 1976, at 374, which is incorporated herein by reference. The voltage signal at terminal 185 from the output of the low-pass filter 184 shown in FIG. 3 and FIG. 7 is applied to the non-inverting input terminal of a conventional opamp 207. The inverting input terminal of opamp 207 is tied to its output terminal 205, which is in turn connected to the emitter terminal of diode-connected npn BJT 211 and to the input terminal of an inverter 255 whose output is connected to the gate terminal 256 of p-channel MOSFET 257. The base and collector terminals of transistor 211 are connected to the drain terminal of p-channel MOSFET 257. The gate terminal 256 of MOSFET 257 is biased with the inverse of the DC feed-back voltage of opamp 207 via inverter 255, which turns on MOSFET 257 to provide a current for the diode connected transistor 211, the drain and substrate terminals of MOSFET 257 being connected to $V_{CC}$ supply voltage node 258, which is nominally at 2.7 V. The currents leaving the emitter terminal of transistor 211 and output terminal 205 of opamp 207 pass through a resistor 203 to the ground node 201. This arrangement produces approximately 20 $\mu$A of current through the drain terminal of MOSFET 257 when node 205 is nominally set to 0.5V and resistor 203 is 25 k$\Omega$.

The voltage at node 213 is applied to the collector and base terminals of diode-connected npn BJT 233. The emitter of transistor 233 is connected to first charge pump stage consisting of a diode connected BJT 235 and a capacitor 243. Node 213 is also connected to source terminals of p-channel MOSFETs 223 and 231 of inverters formed by n-channel and p-channel MOSFETs pairs 221, 223 and 227, 231, respectively. The gate terminals 422 of MOSFETs 221 and 223 are connected to the output of voltage level converter 189 shown in FIG. 3 and FIG. 4A. The amplitude of the signal entering terminal 422 from the voltage converter 189 is CMOS level, and the frequency of the signal is 3.84 MHz. The drain terminal of p-channel MOSFET 223 is connected to the drain terminal of n-channel MOSFET 221 at node 225. Node 225 is tied to the gate terminals of n-channel and p-channel MOSFET transistors 227 and 231, respectively. The drain terminal of panel MOSFET 231 is connected to the drain terminal of n-channel MOSFET 227 at node 229. The source terminals of n-channel MOSFETs 221 and 227 are each tied to the ground node 201.

MOSFETs 221, 223 and 227 and 231 function as two inverter circuits connected in series which work as an amplitude regulator to control the amplitude of the input signal applied to node 422 so that the resulting charge-pump output voltage can be defined by the formula: $V_G=(n+1)V_{in}$, where $V_G$ is the gate voltage applied to the gate terminals of the variable MOSFET resistors shown in FIG. 1, n is the number of charge pump stages plus one and $V_{in}$ is the signal present at input terminal 185.

Node 225 is connected to the capacitors of the odd numbered charge pump stages. Thus, in the exemplary embodiment where n equals seven and there are six charge pump stages, node 225 is connected to capacitors $C_1$ 243, $C_3$ (not shown), and $C_5$ 245. In contrast, node 229 is connected to the capacitors of the even numbered charge pump stages. Thus, in the exemplary embodiment described, terminal 229 is connected to capacitors $C_2$ 244, $C_4$ (not shown), and $C_6$ 247. Bach charge pump stage capacitor 243, 244, 245 and 247 has a capacitance of 0.5 pF.

The charge pump capacitors in turn are also connected to the collector and base terminals of the diode connected BJTs 235, 237, 239, and 241. Thus, $C_1$ 243, is connected to node 261, $C_2$ is connected to node 259, $C_3$ and $C_4$ and their associated diode connected BJTs are not shown, $C_5$ 245 is connected to node 257 and $C_6$ is connected to node 255. The diode connected BJTs are connected in series, with emitter terminal of BJT 235 connected to collector and base terminals 259 of BJT 237 and so on with the emitter terminal of final stage BJT 241 connected to terminal 253 which provides the desired $V_G$ output voltage. Output voltage terminal 253 is also connected to capacitor $C_7$ 249, having a capacitance of 10 pF, and the drain terminal of an n-channel MOSFET active load 251, which provides a discharge path for the pull-down operation of the charge-pump. The source terminal of the MOSFET load 251 is connected to the ground node 201. The gate terminal of transistor 251 is connected to the gate and drain terminals of an n-channel MOSFET 270 at node 271. Node 271, in turn, is connected to terminal 272 for receiving $V_{bias}$ through a resistor 272. The voltage $V_{bias}$ may be generated by a voltage divider circuit between the $V_{CC}$ voltage supply node 258 and ground node 201. The voltage $V_{bias}$ is selected to ensure that approximately 10 $\mu$A of current flows through MOSFET transistor 270

In the exemplary embodiment of the charge pump shown in FIG. 8. polysilicon to polysilicon or metal to metal capacitors are employed, which reduces the parasitic capacitance in the circuit. Accordingly, the output voltage $V_G$ is related to the input $V_{in}$ voltage by the formula: $V_G=(n+1)V_{in}$, where n is the number of charge pump stages plus one. Consequently, in the exemplary embodiment, where n is seven and $V_{in}$ generated by the low-pass filter 184 shown in FIG. 3 and FIG. 7 is approximately 0.5 V, $V_G$ is 4 V, which is sufficient to guarantee operation in the triode region for the tunable MOSFET resistors in the circuit illustrated in FIG. 1.

Figure 9:
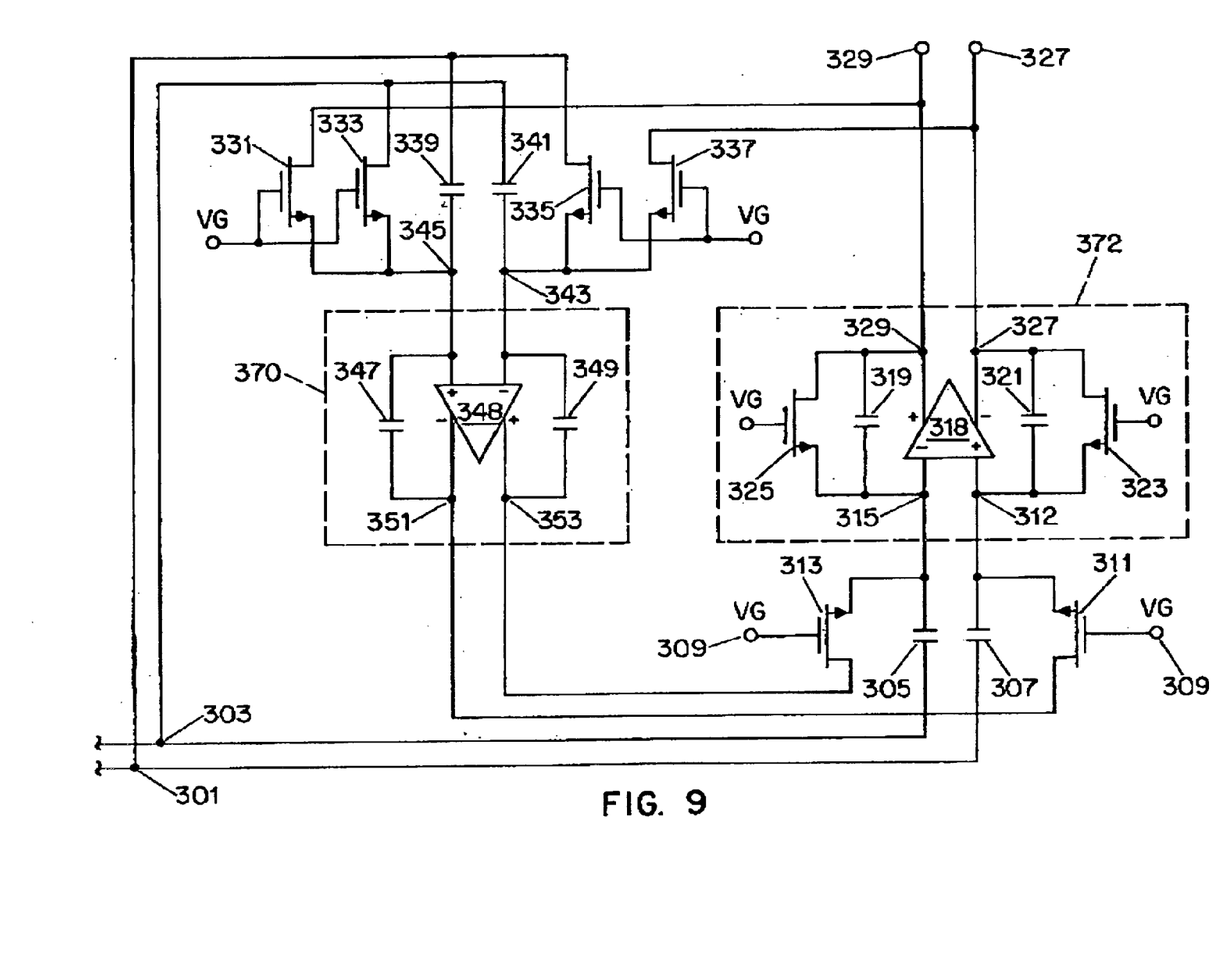
FIG. 9 is a circuit diagram of a phase equalizer circuit useful at the output of the circuit illustrated in FIG. 1.

In FIG. 9, a phase equalization circuit for use in the active filter of FIG. 1 is illustrated. Such a circuit is well known to one of ordinary skill in the art. The circuit is useful to linearize the group delay characteristic of the fifth order filter of the exemplary embodiment illustrated in FIG. 1. The output signals from output terminals 35 and 36 of the active filter 100 illustrated in FIG. 1 are supplied to the input terminals 303 and 301 of the phase equalization circuit, respectively. The signals then enter through two circuit paths. In the first path, the signals received at input terminals 303, 301 are applied to capacitors 305 and 307, respectively. The signal then enters fully balanced amplifier 318, feedback capacitors 319 and 321 and variable n-channel MOSFET feedback resistors 325 and 323 connected between amplifier input terminal 315 and 317 and amplifier output terminals 329 and 327, respectively. The signals at amplifier output terminals 329 and 327 are fed to the second circuit path, first to variable n-channel MOSFET resistors 331 and 337, then to a second fully balanced amplifier 348, feedback capacitors 347 and 349 connected between amplifier input terminals 345 and 343 and amplifier output terminals 351 and 353, respectively.

In the second circuit path, the input signal present at input terminal 301 is coupled through variable MOSFET resistor 335 and capacitor 339 to inputs 345 and 343, respectively of fully balanced amplifier 348. The input signal present at terminal 303 is coupled through variable MOSFET resistor 333 and capacitor 341 to inputs 345 and 343, respectively of fully balanced amplifier 348. The balanced output signals from amplifier 348 present at nodes 351 and 353 are fed trough variable MOSFET resistors 313, 311, to the input terminals 315, 317, respectively, of fully balanced amplifier 318.

In the exemplary embodiment illustrated, the fully balanced amplifiers 318, 348, capacitors 305, 307, 319, 321, 339, 341, 347 and 349, and variable MOSFET resistors 311, 313, 323, 325, 331, 333, 335 and 337 are respectively identical in construction to those in the fully balanced amplifiers, linear capacitors and variable MOSFET resistors of the integrators 72, 71, 21, 22 and 23 of the active filter 100 shown in FIG. 1, except the variable MOSFET resistors are each designed to have a nominal resistance of 10 kΩ at the same gate voltage used in the filter 100 of FIG. 1, and capacitors 339, 341, 347 and 349 each has a capacitance of 21.3 pF while capacitors 205, 307, 319 and 321 each has a capacitance of 8.3 pF. The gate voltage controlling the variable MOSFET resistors in the circuit of FIG. 9 is the same as that controlling the variable MOSFET resistors in the circuit 100 of FIG. 1 and is generated by the circuit shown in FIG. 3.

The foregoing merely illustrates the principles of the invention in an exemplary embodiment. Various modifications and alterations to the described embodiments will be apparent to those skilled in the art in view of the teachings herein. Particularly, the invention can be used in filters with numerous frequency response shapes, not simply the low-pass filter for a direct conversion or zero intermediate frequency receiver illustrated. Moreover, numerous deviations from the circuit topology shown in the attached drawings are possible. By way of example, it is possible to eliminate the coupling capacitors 43A, 43B, 43C and 43D, and 58A, 58B, 58C and 58D in the circuit 100 shown in FIG. 1. It will thus be fully appreciated that those skilled in the art will be able to devise numerous systems and methods which, although not explicitly shown or described, embody the principles of the invention and are thus within the spirit and scope of the invention as defined by the appended claims.

What is claimed is:

1. An active filter having a first filter input terminal, a second filter input terminal, a first filter output terminal and a second filter output terminal, comprising:

a first fully balanced integrator comprising a first fully balanced amplifier having a first non-inverting input, a first inverting input, a first inverting output and a first non-inverting output, a first capacitance element and a first variable value resistance element coupled in parallel between said first non-inverting input and said first inverting output, a second capacitance element and a second variable value resistance element coupled in parallel between said first inverting input and said first non-inverting output, a first linear resistance element coupled between said first filter input terminal and said first non-inverting input, a second linear resistance element coupled between said second filter input terminal and said first inverting input, a third variable resistance element having a first and second end, said first end coupled to said first non-inverting input terminal, and a fourth variable resistance element having a first and second end, said first end coupled to said first inverting input terminal;

a last fully balanced integrator comprising a second fully balanced amplifier having a second non-inverting input, a second inverting input, a second inverting output and a second non-inverting output, a third capacitance element and a fifth variable value resistance element coupled in parallel between said second non-inverting input and said second inverting output, a fourth capacitance element and a sixth variable value resistance element coupled in parallel between said second inverting input and said second non-inverting output, a seventh variable value resistance element having a first end and a second end, said first end coupled to said second non-inverting input, and an eighth variable value resistance element having a first end and a second end, said first end coupled to said second inverting input;

a filter gain compensation stage comprising a third fully balanced amplifier having a third non-inverting input, a third inverting input, a third inverting output coupled to said first filter output terminal and a third non-inverting output coupled to said second filter output terminal, a third linear resistance element coupled between said third non-inverting input and said third inverting output, a fourth linear resistance element coupled between said third inverting input and said third non-inverting output, a ninth variable value resistance element coupled between said third non-inverting input and said second non-inverting output, and a tenth variable value resistance element coupled between said third inverting input and said second inverting output;

at least one intermediate fully balanced integrator coupled in succession between said first and last fully balanced integrator, each intermediate fully balanced integrator comprising a fourth fully balanced amplifier having a fourth non-inverting input, a fourth inverting input, a fourth inverting output and a fourth non-inverting output, a fifth capacitance element coupled between said fourth non-inverting input and said fourth inverting output, a sixth capacitance element coupled between said fourth inverting input and said fourth non-inverting output, an eleventh variable value resistance element coupled between said fourth non-inverting input and the non-inverting output of the amplifier of a respective one of the fully balanced integrator coupled to immediately precede said intermediate fully balanced integrator, a twelfth variable value resistance element coupled between said fourth inverting input and the inverting output of the amplifier of a respective one of the fully balanced integrator coupled to immediately precede said intermediate fully balanced integrator, a thirteenth variable value resistance element coupled between said fourth non-inverting input and the inverting output of the amplifier of a respective one of the fully balanced integrator coupled to immediately succeed said intermediate fully balanced integrator, and a fourteenth variable value resistance element coupled between said fourth inverting input and the non-inverting output of the amplifier of a respective one of the fully balanced integrator coupled to immediately succeed said intermediate fully balanced integrator; and wherein said second end of said third variable resistance element is coupled to the inverting output of the amplifier of a respective one of the at least one of the intermediate fully balanced integrator coupled to immediately succeed said first fully balanced integrator, said second end of said fourth variable resistance element is coupled to the non-inverting output of the amplifier of a respective one of the at least one intermediate fully balanced integrator coupled to immediately succeed said first fully balanced integrator, said second end of said seventh variable value resistance element is coupled to the non-inverting output of the amplifier of a respective one of the at least one intermediate fully balanced integrator coupled to immediate precede said last fully balanced amplifier and said second end of said eighth variable value resistance element is coupled to the inverting output of the amplifier of a respective one of the at least one intermediate fully balanced integrator coupled to immediately precede said last fully balanced amplifier.

2. The active filter of claim 1, wherein said first and second linear resistance elements are fixed value polysilicon resistors.

3. The active filter of claim 1, wherein said first and second variable value resistance elements are metal oxide semiconductor field effect transistors each having a source, drain and gate terminal, wherein the resistance between said source and drain terminals may be tuned by a voltage applied to said gate terminal.

4. The active filter of claim 1, wherein the gain of said filter gain compensation stage corresponds to the ratio of the resistance of said first linear resistance element to the resistance of said first variable value resistance element.

5. The active filter of claim 1, wherein the resistance of said third linear resistance element is proportional to twice the resistance of said first linear resistance element.

6. The active filter of claim 1, further comprising a phase equalizer coupled to said first and second filter output terminals.

7. The active filter of claim 1, wherein said at least one intermediate fully balanced integrator comprises at least a first, second and third intermediate fully balanced integrator, further comprising:

a seventh capacitance element, coupled between said first inverting input and said fourth inverting output of the fourth fully balanced amplifier of said second intermediate fully balanced integrator;

an eighth capacitance element, coupled between said first non-inverting input and said fourth non-inverting output of the fourth fully balanced amplifier of said second intermediate fully balanced integrator;

a ninth capacitance element, coupled between said first non-inverting output and said fourth non-inverting input of the fourth fully balanced amplifier of said second intermediate fully balanced integrator;

a tenth capacitance element, coupled between said first inverting output and said fourth inverting input of the fourth fully balanced amplifier of said second intermediate fully balanced integrator;

an eleventh capacitance element, coupled between said second inverting input and said fourth inverting output of the fourth fully balanced amplifier of said second intermediate fully balanced integrator;

a twelfth capacitance element, coupled between said second non-inverting input and said fourth non-inverting output of the fourth fully balanced amplifier of said second intermediate fully balanced integrator;

a thirteenth capacitance element, coupled between said second non-inverting output and said fourth non-inverting input of the fourth fully balanced amplifier of said second intermediate fully balanced integrator; and a fourteenth capacitance element, coupled between said second inverting output and said fourth inverting input of the fourth fully balanced amplifier of said second intermediate fully balanced integrator.

* * * * *